(12) United States Patent
Seo et al.

(10) Patent No.: US 11,679,543 B2
(45) Date of Patent: Jun. 20, 2023

(54) IMPRINTING DEVICE AND IMPRINTING METHOD

(71) Applicant: ITED INC., Daejeon (KR)

(72) Inventors: Jee-Hoon Seo, Namyangju-si (KR); Kum-Pyo Yoo, Anseong-si (KR); Yu-Heon Yi, Sejong (KR)

(73) Assignee: ITED INC., Daejeon (KR)

( * ) Notice: Subject to any disclaimer, the term of this patent is extended or adjusted under 35 U.S.C. 154(b) by 134 days.

(21) Appl. No.: 17/275,999

(22) PCT Filed: Sep. 10, 2019

(86) PCT No.: PCT/KR2019/011685
§ 371 (c)(1),
(2) Date: Mar. 12, 2021

(87) PCT Pub. No.: WO2020/055086
PCT Pub. Date: Mar. 19, 2020

(65) Prior Publication Data
US 2022/0032532 A1 Feb. 3, 2022

(30) Foreign Application Priority Data

Sep. 12, 2018 (KR) .................. 10-2018-0109067
Nov. 8, 2018 (KR) .................. 10-2018-0136713

(51) Int. Cl.
*B29C 59/16* (2006.01)
*B29C 59/02* (2006.01)
(Continued)

(52) U.S. Cl.
CPC .............. *B29C 59/16* (2013.01); *B29C 59/02* (2013.01); *B29C 35/0805* (2013.01);
(Continued)

(58) Field of Classification Search
CPC ......... B29C 59/16; B29C 59/02; B29C 59/04; B29C 2059/023; B29C 35/0805; B29C 2035/0811; G03F 7/00; G03F 9/00
(Continued)

(56) References Cited

FOREIGN PATENT DOCUMENTS

| KR | 10-2003-0083644 A | 10/2003 |
| KR | 10-2008-0085510 A | 10/2003 |

(Continued)

OTHER PUBLICATIONS

KR200800855A, Kang et al., Korea Ind Tech Inst, Sep. 4, 2008, machine translation to English (Year: 2008).*

(Continued)

*Primary Examiner* — Joseph S Del Sole
*Assistant Examiner* — Lawrence D. Hohenbrink, Jr.
(74) *Attorney, Agent, or Firm* — Knobbe, Martens, Olson & Bear, LLP

(57) ABSTRACT

This application relates to an imprinting apparatus and method. In one aspect, the imprinting apparatus applies pressure between a master substrate and a polymer film to transfer a pattern formed on the master substrate to the polymer film. The imprinting apparatus includes a plurality of coils and the surface of the master substrate is heated by an electromagnetic field induced by the plurality of coils. Through holes are defined in each of the plurality of coils, and support bars are inserted into the through holes. The positions of the plurality of coils are changed corresponding to the master substrate.

15 Claims, 7 Drawing Sheets

(51) Int. Cl.
 *B29C 35/08* (2006.01)
 *G03F 9/00* (2006.01)
 *B29C 59/04* (2006.01)
 *G03F 7/00* (2006.01)

(52) U.S. Cl.
 CPC ....... *B29C 59/04* (2013.01); *B29C 2035/0811* (2013.01); *B29C 2059/023* (2013.01); *G03F 7/00* (2013.01); *G03F 9/00* (2013.01)

(58) Field of Classification Search
 USPC .............................................. 264/40.5, 405
 See application file for complete search history.

(56) References Cited

FOREIGN PATENT DOCUMENTS

| KR | 10-0755235 B1 | | 9/2007 |
|---|---|---|---|
| KR | 20080085510 A | * | 9/2008 |
| KR | 10-0885670 B1 | | 2/2009 |
| KR | 10-2017-0023620 A | | 3/2017 |
| KR | 20170023620 A | * | 3/2017 |

OTHER PUBLICATIONS

KR200800855A, Kang et al., Korea Ind Tech Inst, Sep. 4, 2008, Abstract in English (Year: 2008).*
KR20170023620A, Kang et al., Samsung Electro Meeh, Mar. 6, 2017, Abstract in English (Year: 2017).*
International Search Report and Written Opinion dated Dec. 10, 2019 in International Application No. PCT/KR2019/011685, in 10 pages. (English translation of ISR.).

\* cited by examiner

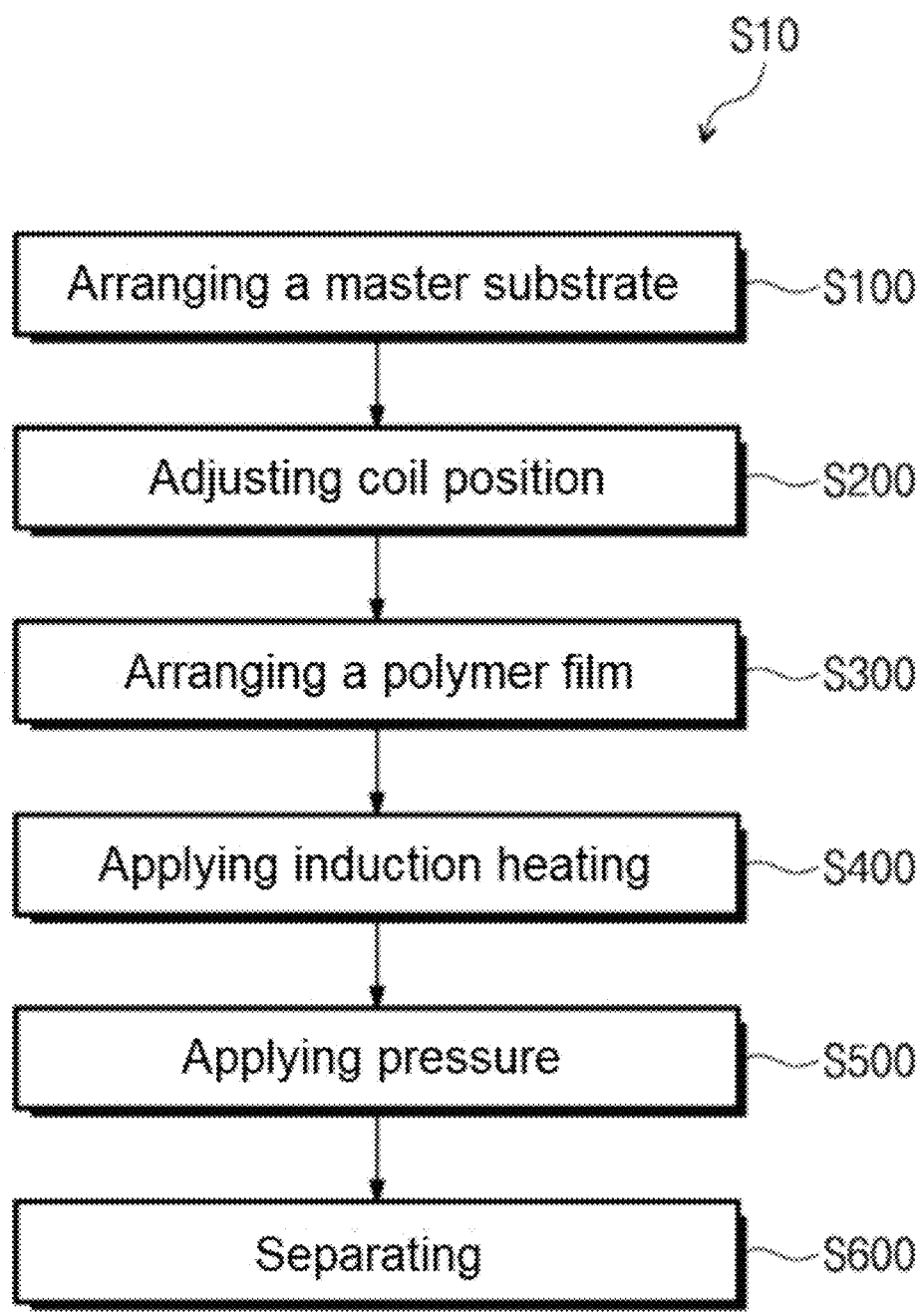

IMPRINTING DEVICE AND IMPRINTING METHOD

The present application is a U.S. national phase application under 35 U.S.C. § 371 of International Application No. PCT/KR2019/011685, filed on Sep. 10, 2019, which claims the benefit of Korean Patent Application Nos. 10-2018-0109067 and 10-2018-0136713 filed on Sep. 12, 2018 and Nov. 8, 2018, respectively, in the Korean Intellectual Property Office, the entire disclosure of each of which is incorporated herein by reference.

BACKGROUND

1. Technical Field

This disclosure relates to an imprinting apparatus and an imprinting method using induction heating through coils.

2. Description of Related Art

A master substrate on which a pattern is formed is pressed onto a polymer film in order to imprint a nano-scale (fine) pattern.

A fine pattern is also heated through a magnetic field formed in a coil in order to reduce an amount of pressure applied on the film.

Here, when the size of the master substrate to be heated is changed, the coil does not uniformly heat the master substrate.

Even though the temperature of the heated coil must be uniform for a high-precision imprinting process, the temperature at which the coil is disposed can differ from each other.

SUMMARY

An object of this disclosure is to heat a master substrate on which a fine pattern is formed using a coil to have a uniform temperature.

Another object of this disclosure is to provide an imprinting apparatus capable of heating master substrates in various sizes.

An imprinting apparatus according to an embodiment of this disclosure may include a first body part providing a support surface and a second body part providing a pressing surface facing the support surface and movable in a vertical direction.

The first body part may include a plurality of coil cores, a plurality of coil lines, a plurality of first support bars, and a plurality of second support bars.

The plurality of coil cores may be arranged in a matrix form and each may be provided with a first through hole formed in a first direction orthogonal to the vertical direction and a second through hole formed in a second direction orthogonal to the vertical direction and the first direction.

Each of the plurality of coil lines may surround the plurality of coil cores.

Each of the plurality of first support bars may pass through the first through holes of corresponding coil cores among the plurality of coil cores.

Each of the plurality of second support bars may pass through the second through holes of corresponding coil cores among the plurality of coil cores.

The imprinting apparatus according to an embodiment of this disclosure may further include a power supply part that provides AC power to the plurality of coil lines.

According to an embodiment of this disclosure, at least a part of the coil cores may move in the first direction along at least one of the plurality of first support bars. At least a part of the coil cores may move in the second direction along at least one of the plurality of second support bars.

The imprinting apparatus according to an embodiment of this disclosure may further include a first upper fixing roper disposed on one side of the first body part, a second upper fixing roller disposed on the other side of the first body part, a first lower fixing roller disposed on one side of the second body part and facing the first upper fixing roller; and a second lower fixing roller disposed on the other side of the second body part and facing the second upper fixing roller.

The imprinting apparatus according to an embodiment of this disclosure may further include a first guide roller disposed adjacent to the first upper fixing roller and the first lower fixing roller; and a second guide roller disposed adjacent to the second upper fixing roller and the second lower fixing roller and rotating in the same direction as the first guide roller.

The imprinting apparatus according to an embodiment of this disclosure may further include a first fixing member disposed on at least one side of the plurality of coil cores and coupled to a corresponding first support bar among the plurality of first support bars; and a second fixing member disposed on the other side of the at least one of the plurality of coil cores and coupled to a corresponding second support bar among the plurality of second support bars.

The imprinting apparatus according to an embodiment of this disclosure may further include a plurality of guide members, each of which is accommodated in each of the first through hole and the second through hole. A first screw pattern may be formed inside each of the plurality of guide members.

According to an embodiment of this disclosure, a second screw pattern corresponding to the first screw pattern may be formed on each of the plurality of first support bars and the plurality of second support bars.

According to an embodiment of this disclosure, the second body part may further include a plurality of temperature sensors arranged in a matrix form corresponding to the plurality of coil cores. The power supply part may supply AC power having different sizes to the plurality of coil lines according to the temperature sensed by each of the plurality of temperature sensors.

According to an embodiment of this disclosure, the first body part may further include a plurality of temperature sensors arranged to correspond to each of the plurality of coil cores. The power supply part may supply AC power having different sizes to the plurality of coil wires according to the temperature sensed by each of the plurality of temperature sensors. Accordingly, AC power having different sizes may be provided to the plurality of coil lines.

According to an embodiment of this disclosure, the second body part may include a pipe for guiding cooling water.

An imprinting method according to an embodiment of this disclosure may include: arranging a master substrate on which a fine pattern is formed, at least partially covered by a metal coating layer, on a support surface provided by a first body part; arranging a polymer film between the master substrate and a second body part providing a pressing surface facing the support surface, wherein the first body part includes a plurality of coil cores each having a first through hole formed in a first direction and a second through hole formed in a second direction orthogonal to the first direction, a plurality of coil lines each surrounding the plurality of coil cores, a plurality of first support bars each passing through the first through holes of corresponding coil cores among the plurality of coil cores; and a plurality of second support bars each passing through the second through holes of corresponding coil cores among the plurality of coil cores; heating the metal coating layer of the master substrate by providing AC power to the plurality of coil lines; applying pressure to the master substrate and the polymer film on the first body part and the second body part; and increasing the distance between the first body part and the second body part.

According to an embodiment of this disclosure, the imprinting process may be performed with only a small pressure, thereby reducing a defect rate and increasing a process speed.

In addition, according to this disclosure, it is possible to improve the accuracy of the process by uniformly heating the master substrate. It is also possible to flexibly respond to master substrates in various sizes, thereby improving the convenience of the process.

BRIEF DESCRIPTION OF THE DRAWINGS

FIG. 8 is a flowchart illustrating an imprinting method according to an embodiment of this disclosure.

DETAILED DESCRIPTION

Figure 1:
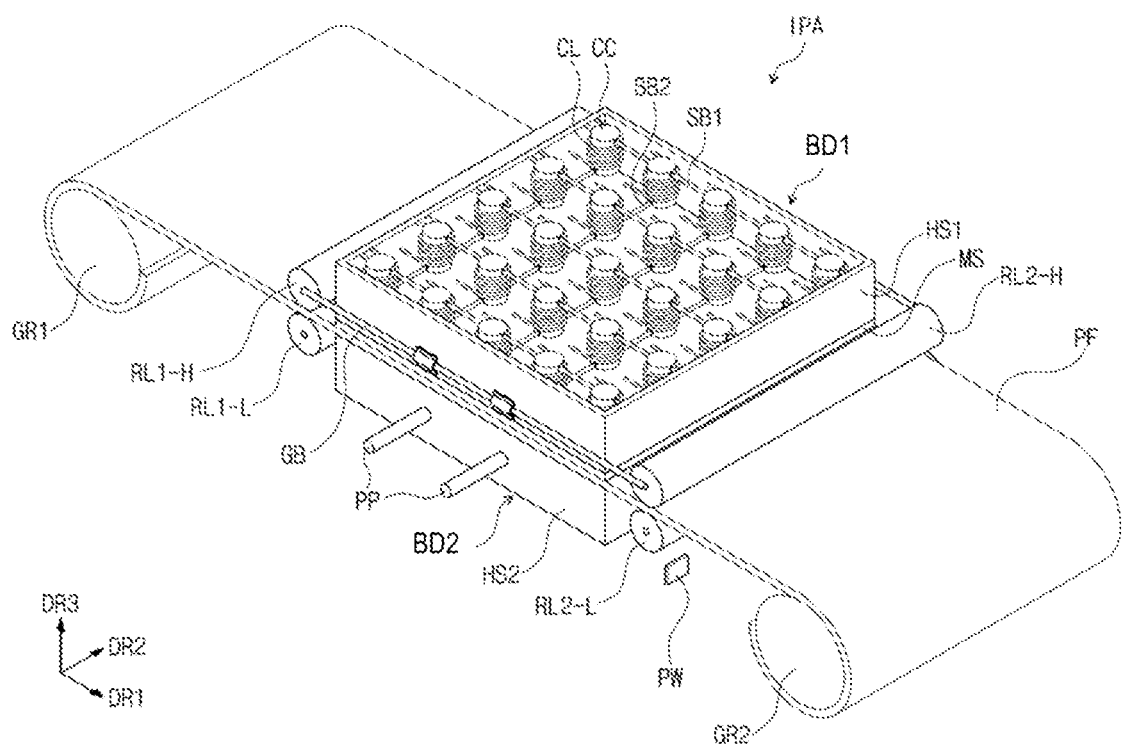
FIG. 1 is a diagram illustrating an imprinting apparatus according to an embodiment of this disclosure.

Further features of the present disclosure will become apparent from the following description of exemplary embodiments with reference to the attached drawings.

In the drawings, ratios and dimensions of components are exaggerated for effective description of technical content. The term "and/or" includes all combinations of one or more that the associated configurations can be defined.

In the present description, an expression such as "comprising" or "including" is intended to designate a characteristic, a number, a step, an operation, an element, a part or combinations thereof, and shall not be construed to preclude any presence or possibility of one or more other characteristics, numbers, steps, operations, elements, parts or combinations thereof.

Figure 2:
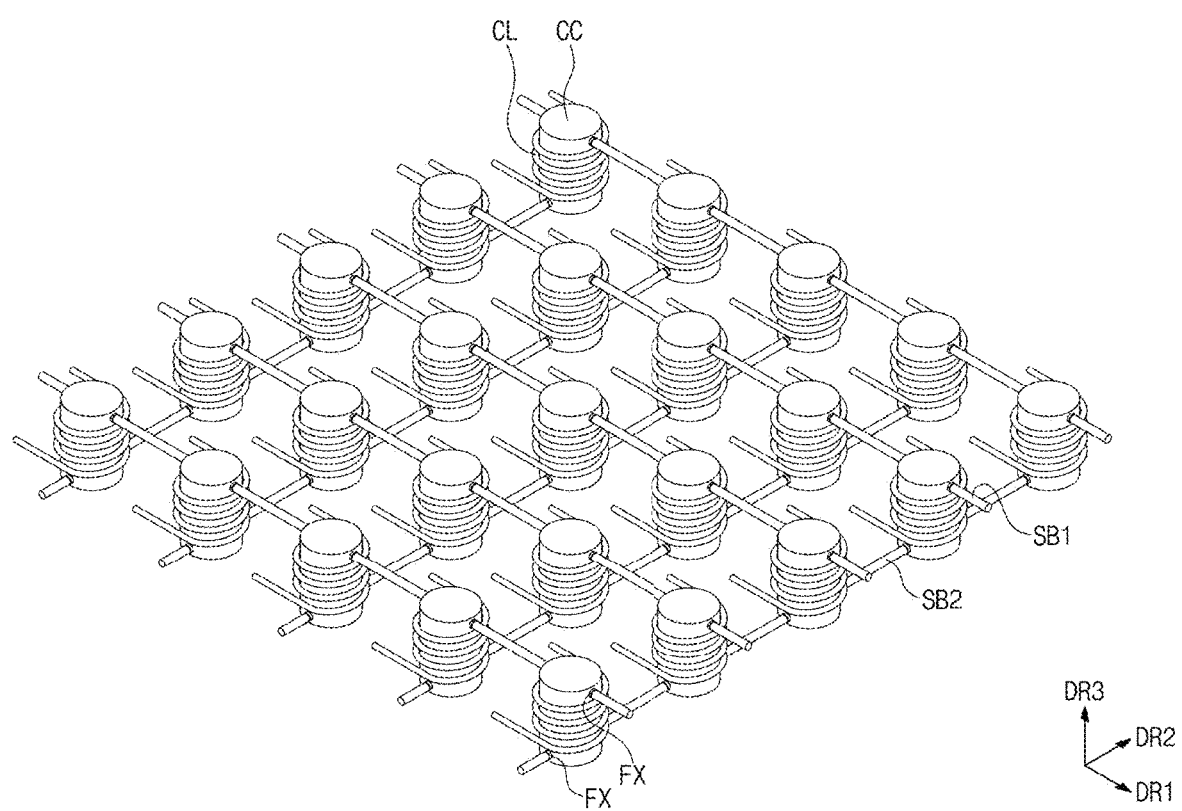
FIG. 2 is a diagram exemplarily illustrating coil cores, coil lines, first support bars, second support bars, and fixing members of FIG. 1.
Figure 3:
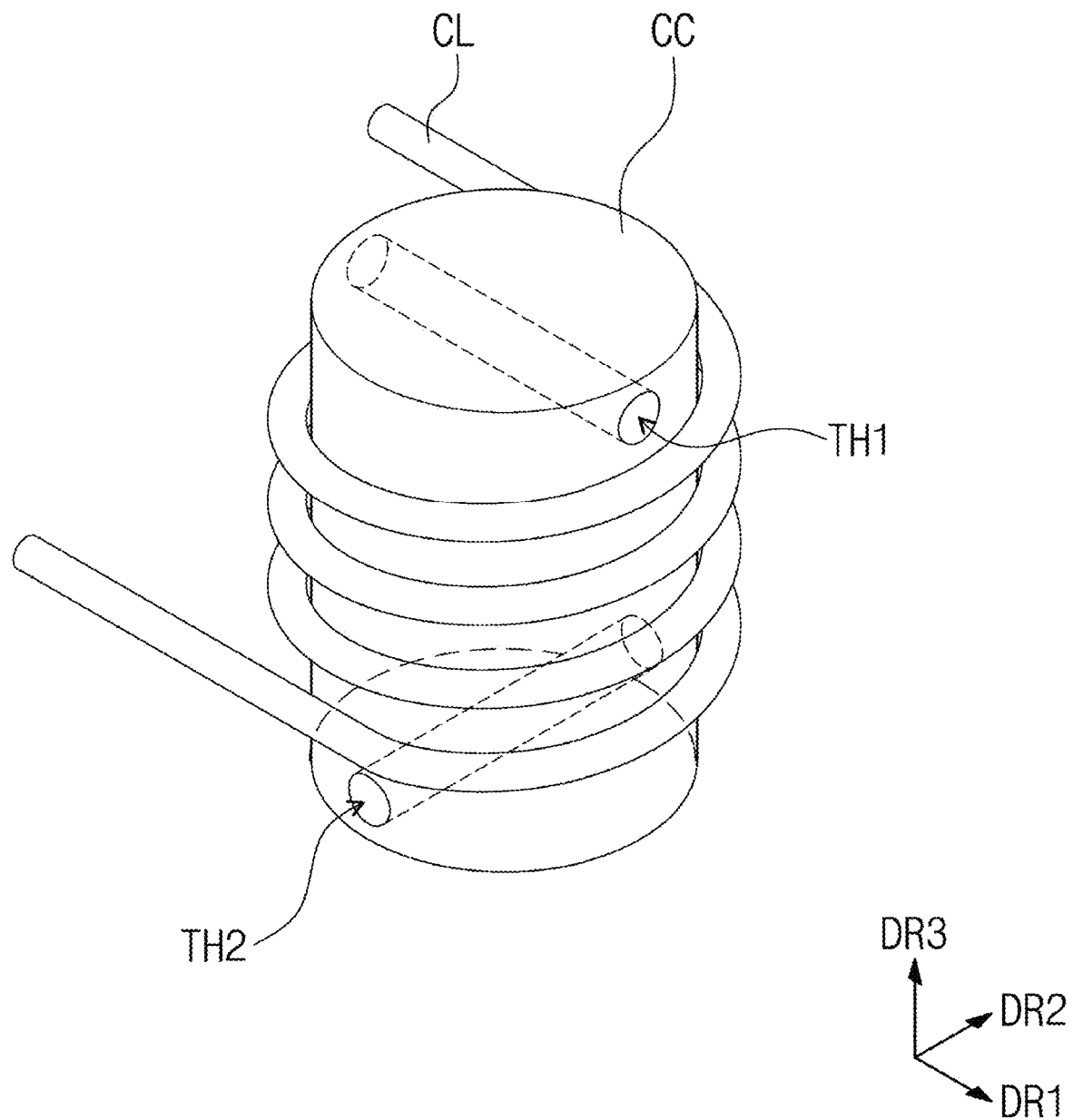
FIG. 3 is a diagram illustrating a coil core according to an embodiment of this disclosure.

FIG. 1 illustrates an imprinting apparatus (IPA) according to an embodiment of this disclosure. FIG. 2 illustrates an exemplary view of coil cores (CC), coil lines (CL), first support bars (SB1), second support bars (SB2), and fixing members (FX) according to an embodiment of this disclosure. FIG. 3 illustrates a coil core (CC) according to an embodiment of this disclosure.

The imprinting apparatus (IPA) may include a first body part (BD1), a second body part (BD2), a master substrate (MS), fixing rollers (RL1-H, RL2-H, RL1-L, RL2-L), guide rollers (GR1, GR2), and a power supply part (PW).

The first body part (BD1) may include a first housing (HS1), a plurality of coil cores (CC), a plurality of coil lines (CL), a plurality of first support bars (SB1), and a plurality of second support bars (SB2), and fixing members (FX).

According to an embodiment of this disclosure, the first housing (HS1) may include coil cores (CC), coil lines (CL), support bars (SB1, SB2), and fixing members (FX).

The first housing (HS1) may provide a support surface for supporting the master substrate (MS).

Referring to FIG. 1 and FIG. 2, the coil cores (CC) may be arranged in a matrix form. In the present specification, the coil cores (CC) arranged in 5×5 is illustrated as an example, but the present disclosure is not limited thereto. The number and arrangement of the coil cores (CC) may be changed as needed.

According to an embodiment of this disclosure, each of the coil cores (CC) may have a cylindrical shape. Each of the coil cores (CC) may include a metallic material.

Each of the coil lines (CL) may surround a corresponding coil core (CC). That is, each of the coil lines (CL) may wind along the outer surface of the corresponding coil core (CC).

When AC power is provided to the coil lines (CL), an inductive magnetic field may be formed inside each of the coil lines (CL) and in the coil core (CC).

Referring to FIG. 3, each of the coil lines (CL) may be provided with a first through hole (TH1) formed in a first direction (DR1) and a second through hole (TH2) formed in a second direction (DR2). In this case, the first direction (DR1) and the second direction (DR2) may be orthogonal to each other.

Each of the first support bars (SB1) may be inserted into the first through holes (TH1) of the corresponding coil cores (CC).

Each of the second support bars (SB2) may be inserted into the second through holes (TH2) of the corresponding coil cores (CC).

At least a part of the coil cores (CC) may be guided by the first support bars (SB1) or the second support bars (SB2) and may be thus moved in the first direction (DR1) or the second direction (DR2).

Accordingly, the overall area in which the coil cores (CC) are disposed may be changed. In addition, some of the coil cores (CC) may be disposed close to each other, and others may be disposed far from each other.

Each of the fixing members (FX) may be arranged adjacent to the coil cores (CC), and may be coupled to a corresponding support bar among the support bars (SB1, SB2).

The fixing members (FX) may prevent the coil cores (CC) from moving in the first direction (DR1) or the second direction (DR2) of the support bars (SB1, SB2). For example, the fixing member (FX) may have a female screw shape and may thus move or fix the coil cores (CC) by rotating the fixing member (FX). Here, a male screw shape or pattern corresponding to the female screw shape or pattern of the fixing member (FX) may be formed on at least a part of the support bars (SB1, SB2).

The second body part (BD2) may include a second housing (HS2) and a pipe (PP).

The second body part (BD2) may be disposed under the first body part (BD1). The second body part (BD2) may move in a third direction (DR3, or up and down) orthogonal to the first direction (DR1) and the second direction (DR2), and may thus apply pressure to an object disposed between the first body part (BD1) and the second body part (BD2).

Accordingly, the second housing (HS2) may provide a pressure surface for applying pressure to another object.

The pipe (PP) may be mounted to penetrate the inside of the second body part (BD2). The pipe (PP) may provide a passage through which a cooling medium (e.g., cooling water) passes. When at least a portion of the imprinting apparatus (IPA) is heated, the temperature of the imprinting apparatus (IPA) may be lowered by using the cooling water flowing through the pipe (PP).

FIG. 1 illustrates that the first body part (BD1) is disposed above the second body part (BD2), but is not limited thereto. In another embodiment of this disclosure, the second body part (BD2) may be disposed above the first body part (BD1).

The first upper fixing roper (RL1-H) may be disposed adjacent to one side of the body part (BD1), and the second upper fixing roller (RL2-H) may be disposed adjacent to the other side of the first body part (BD1).

The first upper fixing roller (RL1-H) and the second upper fixing roller (RL2-H) may be fixed to the first body part (BD1) by a guide bar (GB). However, this disclosure is not limited thereto, and the first upper fixing roller (RL1-H) and the second upper fixing roller (RL2-H) may be fixed adjacent to first body part (BD1) by a separate component other than the guide bar (GB).

The first lower fixing roller (RL1-L) may be disposed adjacent to one side of the second body part (BD2), and the second lower fixing roller (RL2-L) may be disposed adjacent to the other side of the second body part (BD2).

The polymer film (PF) disposed between the first body part (BD1) and the second body part (BD2) may be fixed by the pressure applied between the first upper fixing roller (RL1-H) and the first lower fixing roller (RL1-L) and the pressure applied between the second upper fixing roller (RL2-H) and the second lower fixing roller (RL2-L), That is, when the polymer film (PF) and the master substrate (MS) are pressed by the first body part (BD1) and the second body part (BD2), the fixing rollers (RL1-H, RL2-H, RL2-L) may prevent the polymer film (PF) from moving in the first direction (DR1) or the second direction (DR2).

The first guide roller (GR1) may be disposed adjacent to the first upper fixing roller (RL1-H) and the first lower fixing roller (RL1-L). The second guide roller (GR2) may be disposed adjacent to the second upper fixing roller (RL2-H) and the second lower fixing roller (RL2-L).

The first guide roller (GR1) and the second guide roller (GR2) may guide the polymer film (PF) disposed between the first body part (BD1) and the second body part (BD2). The first guide roller (GR1) and the second guide roller (GR2) may be rotated in the same direction.

The power supply part (PW) may provide power supplied from the outside to the coil lines (CL) in the form of AC power. The power supply part (PW) may provide the same AC power as a whole to the coil lines (CL), or may provide AC power having different sizes to the coil lines (CL) as needed. In FIG. 1, wirings connecting the power supply part (PW) and the coil lines (CL) are not shown for convenience.

Figure 4A:
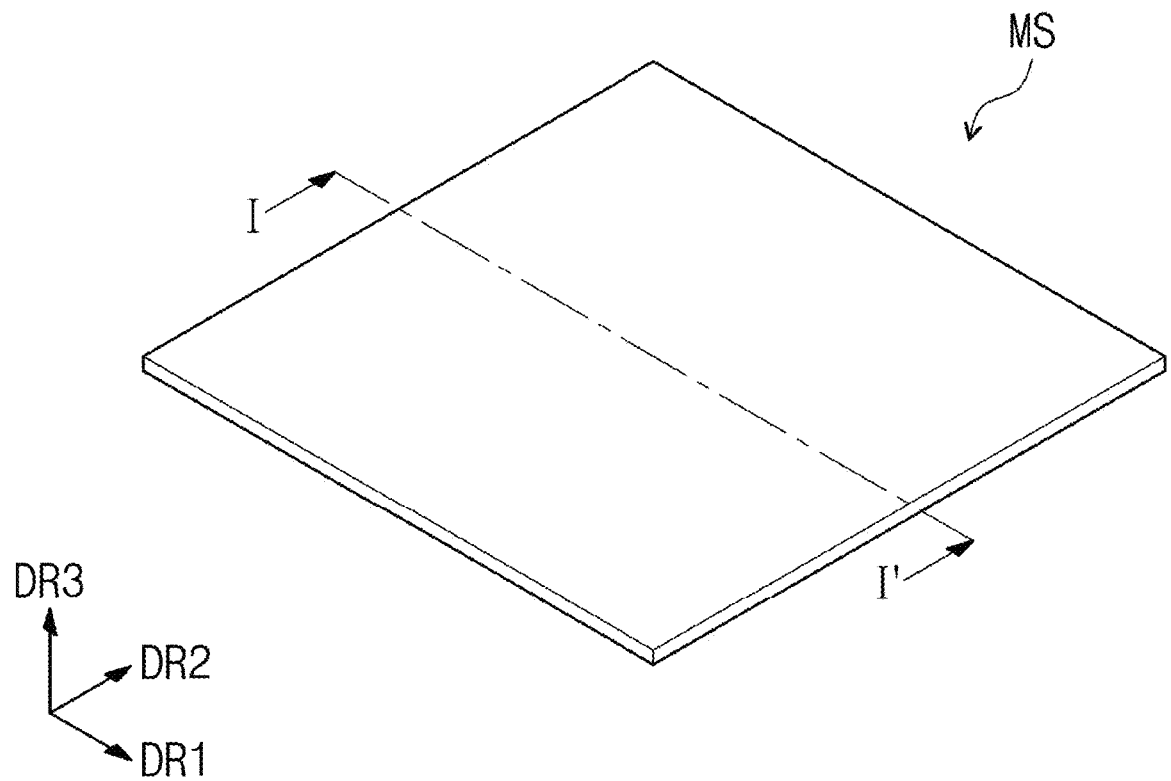
FIG. 4A is a diagram illustrating a master substrate according to an embodiment of this disclosure.
Figure 4B:
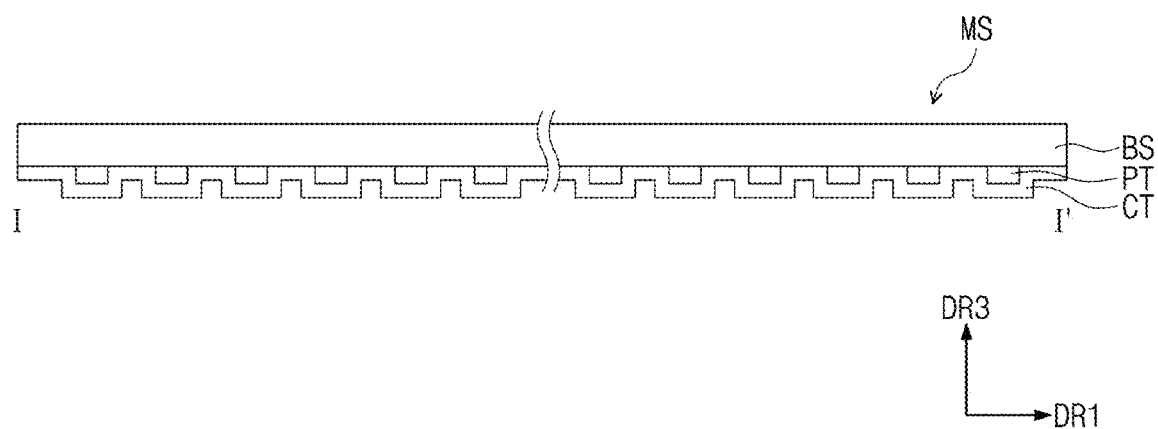
FIG. 4B is a cross-sectional view taken along line of FIG. 4A.

FIG. 4A is an exemplary diagram illustrating a master substrate (MS) according to an embodiment of this disclosure. FIG. 4B is an exemplary cross-sectional view taken along line I-I' of FIG. 4A.

The master substrate (MS) may include a base substrate (BS), a pattern (PT), and a metal coating layer (CT).

The pattern (PT) for determining a shape of an object to be imprinted may be disposed on one surface of the base substrate (BS). Each of the wirings constituting the pattern (PT) may have a thickness of several nanometers to several micrometers.

The metal coating layer (CT) may be disposed on one surface of the base substrate (BS) and may cover the pattern (PT).

The metal coating layer (CT) may be heated by an electromagnetic field induced in the coil lines (CL) and the coil cores (CC). When the heated metal coating layer (CT) is used, the imprinting process on the polymer film (PF) may be easily performed even when a small pressure is applied.

Figure 5:
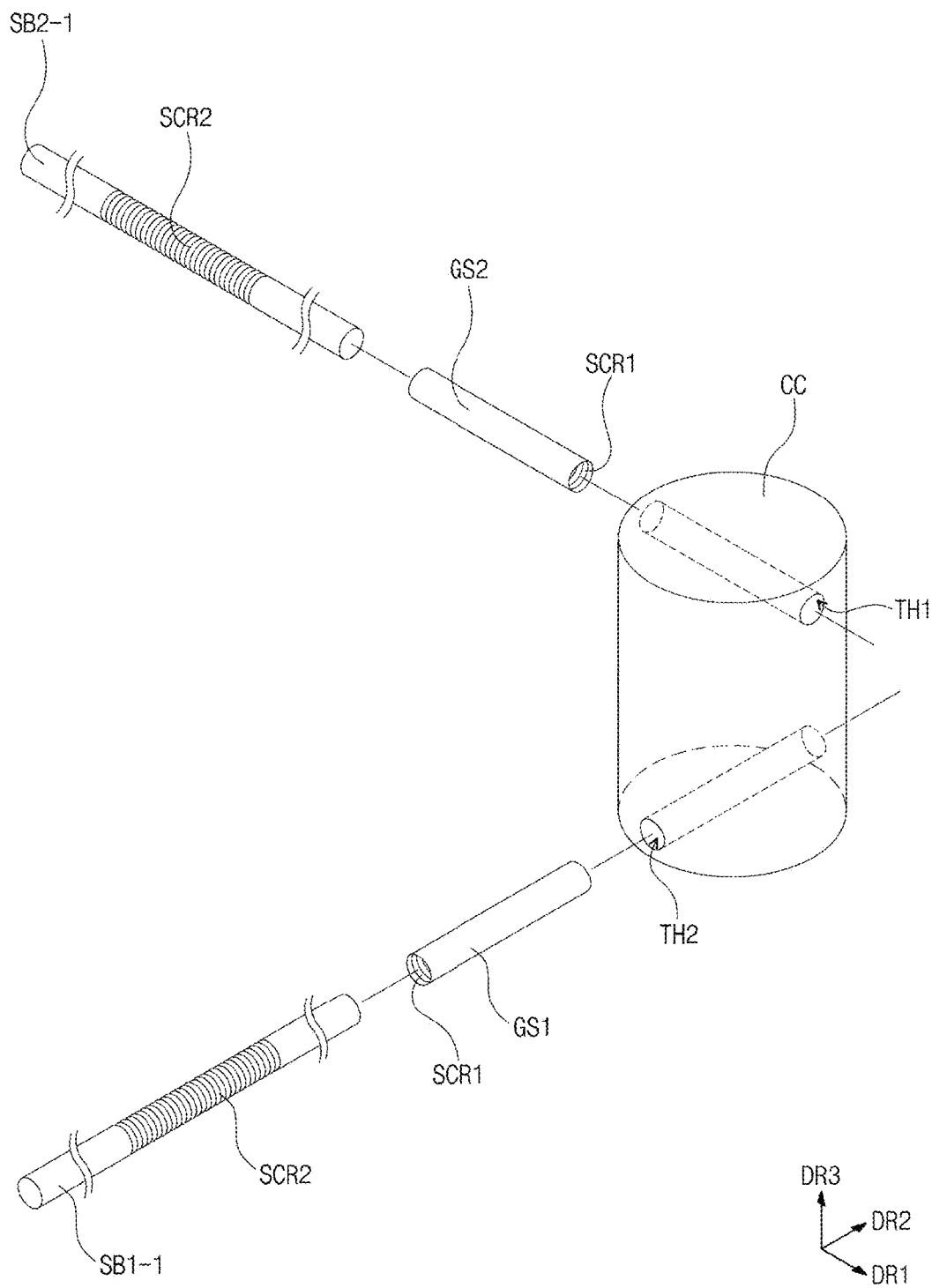
FIG. 5 illustrates a coil core, guide members, and support bars according to an embodiment of this disclosure.

FIG. 5 illustrates a coil core (CC), guide members (GS1, GS2), and support bars (SB1-1, SB2-1) according to an embodiment of this disclosure.

The first guide member (GS1) may be a component inserted into the first through hole (TH1) and the second guide member (GS2) may be a component inserted into the second through hole (TH2).

A first screw pattern (SCR1) may be formed inside each of the first guide member (GS1) and the second guide member (GS2).

The first support bar (SB1-1) may be inserted into the first guide member (GS1), and the second support bar (SB2-1) may be inserted into the second guide member (GS2).

A second screw pattern (SCR2) corresponding to the first screw pattern (SCR1) may be formed on an outer surface of each of the first support bar (SB1-1) and the second support bar (SB2-1).

According to an embodiment of this disclosure, the distance between the coil cores (CC) in the first direction (DR1) may be adjusted by rotating the first guide member (GS1) or the first support bar (SB1-1). In addition, the distance between the coil cores (CC) in the second direction (DR2) may be adjusted by rotating the second guide member (GS2) or the second support bar (SB2-1).

Figure 6:
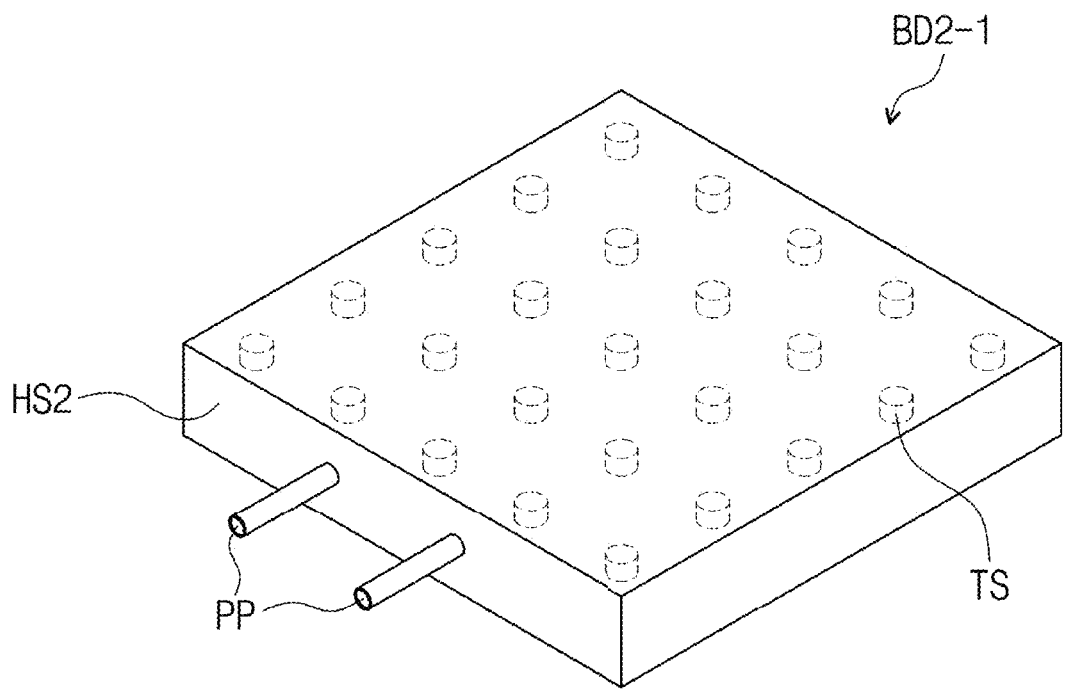
FIG. 6 is a diagram illustrating a second body part according to an embodiment of this disclosure.

FIG. 6 is an exemplary illustration of a second body part (BD2)-1 according to an embodiment of this disclosure.

According to an embodiment of this disclosure, the second body part (BD2-1) may further include a plurality of temperature sensors (TS). The temperature sensors (TS) may be arranged in a matrix form corresponding to the arrangement of the coil cores (CC).

The temperature sensors (TS) may measure temperatures of the coil cores (CC) or the coil lines (CL) during the imprinting process, respectively.

The imprinting apparatus (IPA) may adjust the size of the power supplied by the power supply part (PW) to the coil lines (CL) according to the measured temperature. For example, AC power having a large intensity may be provided to the coil line (CL) corresponding to a portion sensed that the temperature is low, and AC power having a small intensity to the coil line (CL) corresponding to a portion sensed that the temperature is high. Through such adjustment, the imprinting apparatus (IPA) may uniformly heat the metal coating layer (CT) of the master substrate (MS).

In another embodiment of this disclosure, the temperature sensors (TS) may be mounted on the first body part (BD1). In this case, each of the temperature sensors (TS) may be disposed adjacent to a corresponding coil core (CC) among the coil cores (CC).

Figure 7:
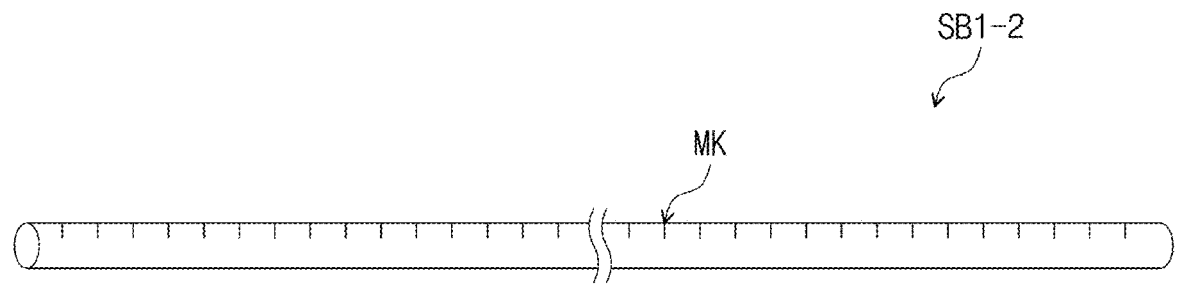
FIG. 7 is a diagram illustrating a first support bar according to an embodiment of this disclosure.

FIG. 7 is an exemplary illustration of a first support bar (SB1-2) according to an embodiment of this disclosure.

A scale or marking (MK) may be displayed on the surface of the first support bar (SB1-2). A user may measure a distance between the coil cores (CC) through the marking (MK) displayed on the surface of the first support bar (SB1-2).

In FIG. 7, only the first support bar (SB1-2) is illustrated as an example, but the marking (MK) may also be displayed on the second support bar.

FIG. 8 is an exemplary flowchart illustrating an imprinting method (310) according to an embodiment of this disclosure.

The imprinting method (310) may include arranging a master substrate (S100), adjusting coil position (S200), arranging a polymer film (S300), applying induction heating (S400), applying pressure (S500), and separating (S600).

In the step of arranging a master substrate (S100), the master substrate (MS) may be arranged between the first body part (BD1) and the second body part (BD2).

In the step of adjusting coil position (S200), the positions of at least a part of the coil cores (CC) may be changed in the first direction (DR1) or the second direction (DR2) in correspondence with the size of the master substrate (MS).

In the step of arranging a polymer film (S300), the polymer film (PF) may be arranged between the master substrate (MS) and the second body part (802).

In the step of applying induction heating (S400), the metal coating layer (CT) of the master substrate (MS) may be heated by an induced magnetic field formed in the coil lines (CL) and the coil cores (CC).

In the step of applying pressure (S500), at least one of the first body part (BD1) and the second body part (BD2) may be moved, and accordingly, the polymer film (PF) and the master substrate (MS) may receive pressure from the first body part (BD1) and the second body part (BD2). In this process, a shape corresponding to the shape of the pattern (PT) formed on the master substrate (MS) may be transferred to the polymer film (PF).

In the step of separating (S600), the first body part (BD1) and the second body part (BD2) may be separated from each other, and accordingly, the polymer film (PF) to which the pattern is transferred may be separated from the master substrate (MS).

According to an embodiment of this disclosure, the imprinting method (310) may further include preheating (not shown) between the step of arranging a master substrate (S100) and the step of applying induction heating (S400).

In the step of preheating, the metal coating layer (CT) of the master substrate (MS) may be heated using an induced magnetic field formed on the coil lines (CL) and the coil cores (CC) to anneal the metal coating layer (CT). The temperature of the metal coating layer (CT) heated in the pre-heating step may be higher than the temperature of the metal coating layer (CT) heated in the step of applying induction heating (S400).

While the foregoing describes certain preferred embodiments of the present disclosure, those of ordinary skill in the art would understand that the present disclosure can be modified and altered in various ways without departing from the spirit of the present disclosure disclosed in the claims by supplementing, altering, omitting, or adding one or more elements, and it should be noted that such modifications and alterations are encompassed within the scope of rights of the present disclosure.

INDUSTRIAL AVAILABILITY

As the demand for electronic products with small-size and high aesthetics increases, it is very important to imprint fine patterns. According to this disclosure, an imprinting process with high precision can be performed, and accordingly, this disclosure has high industrial applicability.

What is claimed is:

1. An imprinting apparatus comprising:
a first body part providing a support surface; and
a second body part providing a pressing surface facing the support surface and being movable in a vertical direction,
wherein the first body part comprises:
a plurality of coil cores arranged in a matrix form, each having a first through hole formed in a first direction orthogonal to the vertical direction and a second through hole formed in a second direction orthogonal to the vertical direction and the first direction;
a plurality of coil lines respectively surrounding the plurality of coil cores;
a plurality of first support bars each passing through the first through holes of a first set of the plurality of coil cores; and
a plurality of second support bars each passing through the second through holes of a second set of the plurality of coil cores.

2. The imprinting apparatus of claim 1, further comprising a power supply part configured to provide AC power to the plurality of coil lines.

3. The imprinting apparatus of claim 2, wherein at least a part of the coil cores is movable in the first direction along at least one of the plurality of first support bars and at least a part of the coil cores is movable in the second direction along at least one of the plurality of second support bars.

4. The imprinting apparatus of claim 3, further comprising:
a first upper fixing roller disposed on a first side of the first body part;
a second upper fixing roller disposed on a second side of the first body part opposing the first side of the first body part;
a first lower fixing roller disposed on a first side of the second body part and facing the first upper fixing roller; and
a second lower fixing roller disposed on a second side of the second body part opposing the first side of the second body part and facing the second upper fixing roller.

5. The imprinting apparatus of claim 4, further comprising:
a first guide roller disposed adjacent to the first upper fixing roller and the first lower fixing roller; and
a second guide roller disposed adjacent to the second upper fixing roller and the second lower fixing roller and configured to rotate in the same direction as the first guide roller.

6. The imprinting apparatus of claim 3, further comprising:
a first fixing member disposed on a first side of the at least one of the plurality of coil cores and coupled to a corresponding first support bar among the plurality of first support bars; and
a second fixing member disposed on a second side of the at least one of the plurality of coil cores opposing the first side of the at least one of the plurality of coil cores and coupled to a corresponding second support bar among the plurality of second support bars.

7. The imprinting apparatus of claim 3, further comprising a plurality of guide members each being accommodated in each of the first through holes and the second through holes, wherein a first screw pattern is formed inside each of the plurality of guide members.

8. The imprinting apparatus of claim 7, wherein a second screw pattern corresponding to the first screw pattern is formed on each of the plurality of first support bars and the plurality of second support bars.

9. The imprinting apparatus of claim 3, wherein the second body part further comprises a plurality of temperature sensors arranged in a matrix form corresponding to the plurality of coil cores, and
wherein the power supply part is configured to supply AC power having different sizes to the plurality of coil lines according to the temperature sensed by each of the plurality of temperature sensors.

10. The imprinting apparatus of claim 3, wherein the first body part further comprises a plurality of temperature sensors arranged to correspond to each of the plurality of coil cores, and
wherein the power supply part is configured to supply AC power having different sizes to the plurality of coil lines according to the temperature sensed by each of the plurality of temperature sensors.

11. The imprinting apparatus of claim 3, wherein the second body part comprises a pipe configured to guide cooling water.

12. An imprinting method comprising:
arranging a master substrate on which a fine pattern is formed, at least partially covered by a metal coating layer, on a support surface provided by a first body part;
arranging a polymer film between the master substrate and a second body part providing a pressing surface facing the support surface, wherein the first body part comprises: a plurality of coil cores each having a first through hole formed in a first direction and a second through hole formed in a second direction orthogonal to the first direction, a plurality of coil lines respectively surrounding the plurality of coil cores, a plurality of first support bars each passing through the first through holes of a first set of the plurality of coil cores, and a plurality of second support bars each passing through the second through holes of a second set of the plurality of coil cores;
heating the metal coating layer of the master substrate by providing AC power to the plurality of coil lines;
applying pressure to the master substrate and the polymer film by the first body part and the second body part; and
increasing the distance between the first body part and the second body part.

13. The imprinting method of claim 12, further comprising moving at least a part of the coil cores in the first direction along at least one of the plurality of first support bars or at least a part of the coil cores in the second direction along at least one of the plurality of second support bars.

14. The imprinting method of claim 13, wherein the second body part comprises a plurality of temperature sensors arranged to correspond to the plurality of coil cores and senses the temperature of each of the plurality of coil cores using the plurality of temperature sensors,
wherein a first AC power is provided to a coil core having a sensed temperature of a first temperature among the plurality of coil cores, and
wherein a second AC power greater than the first AC power is provided to a coil core having a sensed temperature of a second temperature lower than the first temperature among the plurality of coil cores.

15. The imprinting method of claim 13, further comprising annealing the metal coating layer of the master substrate by providing AC power to the plurality of coil lines.

* * * * *